United States Patent [19]

Koelter

[11] Patent Number: 5,511,532
[45] Date of Patent: Apr. 30, 1996

[54] DISTRIBUTOR-LESS IGNITION SYSTEM FOR AN INTERNAL COMBUSTION ENGINE

[75] Inventor: Martin Koelter, Munich, Germany

[73] Assignee: Bayerische Motoren Werke AG, Munich, Germany

[21] Appl. No.: 250,741

[22] Filed: May 27, 1994

[30] Foreign Application Priority Data

May 28, 1993 [DE] Germany .......................... 43 17 962.2
Feb. 24, 1994 [DE] Germany .......................... 44 05 994.9

[51] Int. Cl.$^6$ ..................................................... F02P 3/12
[52] U.S. Cl. ..................................................... 123/643
[58] Field of Search ........................ 123/643, 426, 123/635, 620, 414, 618, 605, 655; 315/209 CD

[56] References Cited

U.S. PATENT DOCUMENTS

| | | | |
|---|---|---|---|
| 4,308,488 | 12/1981 | Imai et al. ................. | 315/209 CD |
| 5,109,829 | 5/1992 | Herden et al. .............. | 123/643 |
| 5,125,387 | 6/1992 | De Wit et al. .............. | 123/643 |
| 5,195,496 | 3/1993 | Gokhale ..................... | 123/643 |
| 5,211,152 | 5/1993 | Alexandrov ................. | 123/620 |
| 5,239,973 | 8/1993 | Murata et al. .............. | 123/635 |
| 5,337,717 | 8/1994 | Scheel et al. .............. | 123/426 |
| 5,343,842 | 9/1994 | Fukui ........................ | 123/414 |

FOREIGN PATENT DOCUMENTS

| | | | |
|---|---|---|---|
| 0463842 | 1/1992 | European Pat. Off. ........ | 123/643 |
| 59108873 | 12/1957 | Japan ........................ | 123/643 |
| WO89/00645 | 1/1989 | WIPO ........................ | 123/643 |
| WO89/02527 | 3/1989 | WIPO ........................ | 123/643 |

Primary Examiner—Raymond A. Nelli
Attorney, Agent, or Firm—Evenson, McKeown, Edwards & Lenahan

[57] ABSTRACT

A distributor-less ignition system for an internal combustion engine, having a control unit and an ignition coil coupled to the control unit. The ignition coil has a primary coil switched by the control unit and a secondary coil that has a terminal. A plurality of spark plugs are electrically connected at one end of the secondary coil to the same terminal of the secondary coil. A controllable semiconductor switch is respectively electrically connected between the terminal and each of the spark plugs. The semiconductor switch for the spark plug to be triggered is switched at least approximately at the same time by the control unit as the primary coil.

8 Claims, 2 Drawing Sheets

DISTRIBUTOR-LESS IGNITION SYSTEM FOR AN INTERNAL COMBUSTION ENGINE

BACKGROUND AND SUMMARY OF THE INVENTION

The present invention relates to a distributor-less ignition system for an internal combustion engine, comprising a control unit, an ignition coil coupled to the control unit, the ignition coil having a primary coil switched by the control unit and a secondary coil that has a terminal, and a plurality of spark plugs electrically connected at one end of the secondary coil.

An ignition system of this type if commercially available under the name individual-coil ignition system. The ignition system is associated with each cylinder of the internal combustion engine, this system comprising an ignition coil and the spark plug connected on the secondary side. The ignition coil is preferably located on the cylinder in question. This ignition system has certain problems in various applications regarding weight and mechanical stability. Particularly with internal combustion engines with few cylinders, the mechanical stress brought about by the rough running at spots is considerable.

An object of the invention is to produce an ignition system of the initially-described type which is distinguished by simplified design and simultaneously, low weight.

This and other objects are achieved by the present invention which provides a distributor-less ignition system for an internal combustion engine, comprising a control unit, an ignition coil coupled to the control unit, the ignition coil having a primary coil switched by the control unit and a secondary coil that has a terminal. A plurality of spark plugs are electrically connected at one end of the secondary coil to the same terminal of the secondary coil. A controllable semiconductor switch is respectively electrically connected between the terminal and each of the spark plugs. The semiconductor switch for the spark plug to be triggered is switched at least approximately at the same time by the control unit as the primary coil.

Since several spark plugs are connected in parallel to the ignition coil in certain embodiments of the invention, the weight is reduced. The weight that must additionally be taken into consideration for the semiconductor switch, however, is negligible by comparison. Because of the simultaneous control of both the primary side and the semiconductor switch located in the lead of the spark plug in question, circuitry expenditure is low. On the other hand, by the control of the primary side of the ignition coil and the spark plug in question, i.e. in practice the secondary side of the ignition coil, misfires which occur in an individual-coil ignition system from imperfect control of two primary coils are avoided. Hence the ignition system is controlled on both the primary and secondary sides, making diagnosis particularly easy.

A preferred embodiment of the semiconductor switch is in the form of a thyristor. In general, such a switch can be controlled with particular precision in terms of its switching behavior.

Certain embodiments of the invention in which the semiconductor switch is built into the spark plug connector inserted in the lead to the spark plug have the advantage that they require only a small space for its accommodation. The arrangement of the thyristor inside the spark plug connector is easily possible.

Making the semiconductor switch an optically triggerable switch in certain embodiments of the invention provides electrical insulation. The lead to the semiconductor switch can be in the form of a light guide and is hence particularly low in weight and free of insulation problems.

Certain embodiments of the invention have advantageous design features which are distinguished by low volume. In this regard U.S. Pat. No. 5,109,829 teaches a distributor-less ignition system with a high-voltage switch. The semiconductor components are disposed on the bottom of a cone at whose vertex the light-emitting element is located. The cone is formed within a housing which is provided with filler material outside the cone. This results in expensive construction and relatively high weight. Moreover, if a large number of semi,conductor components are to be triggered optically, it is necessary to provide a corresponding number of light-emitting elements, which has a negative impact on cost, weight, and the space required to accommodate the switch.

By arranging the semiconductor components around the light-emitting element, as provided in certain embodiments, the number of semiconductor components to be triggered optically by the light-emitted element does not depend on the distance from it but on the size of the surface area of the light-emitting element. Instead of an LED as with the known high-voltage switch, a xenon tube is suitable for this purpose. It has a high light intensity with good triggering behavior and is, simple and sturdy to build and handle.

Features of certain embodiment of the present invention provide the possibility of connecting the spark plugs in a cylinder-selective manner to the high voltage, starting from one spark coil and using spark plug connectors of this type. The additional space required per spark plug is relatively small and looks externally like a mere axial extension of the spark plug connector.

Other objects, advantages and novel features of the present invention will become apparent from the following detailed description of the invention when considered in conjunction with the accompanying drawings.

DETAILED DESCRIPTION OF THE DRAWINGS

Figure 1:
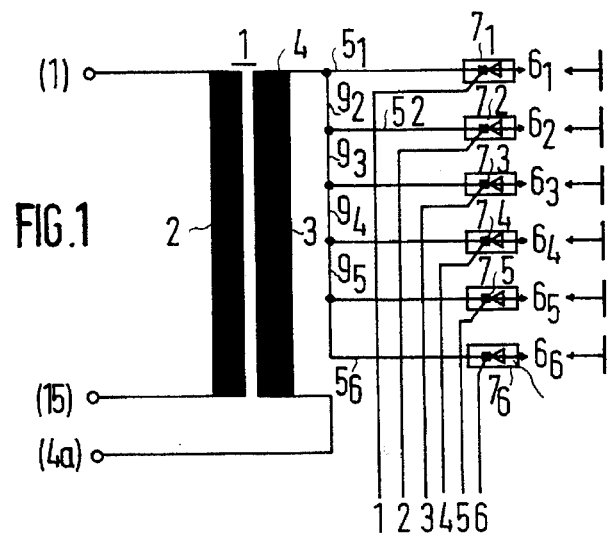
FIG. 1 is a circuit diagram that illustrates the circuitry of an embodiment of the present invention.

The distributor-less ignition system shown in FIG. 1 as a circuit diagram has an ignition coil 1 with a primary coil 2 and a secondary coil 3. Parallel leads $5_1$ to $5_6$ are connected to terminal 4 of the secondary coil 3, and these leads are connected to spark plugs $6_1$ to $6_6$ shown in FIG. 1 as spark gaps. Immediately ahead of each of the spark plugs $6_1$ to $6_6$, a controllable semiconductor switch $7_1$ to $7_6$ is connected to a spark plug connector not shown in detail, whose control leads $8_1$ to $8_6$ lead to control device 10 schematically shown.

Control leads $8_1$ to $8_6$ are designed as light guides and lead to the control electrode of the associated thyristor $7_1$ to $7_6$.

In order to trigger spark plugs $6_1$ to $6_6$, the current flow through the primary coil 1 is interrupted by the control device 10. The ignition spark produced on the secondary side at terminal 4 appears at each of leads $5_1$ to $5_6$ simultaneously. The selection of the actually operative spark plug is made by controlling thyristors $7_1$ to $7_6$, which are on the supply side, via control leads $8_1$ to $8_6$, also by means of the control device 10. Depending on the design, it is possible respectively to trigger only one of the spark plugs at a time. This is operative when only one spark plug at a time is to be triggered in whatever cylinder of the internal combustion engine is in the power stroke, but it is also operative when two spark plugs are to be triggered at a time. This makes it possible to operate four (usually) and preferably six or eight spark plugs with only one spark coil. It should be apparent that this arrangement cuts down on circuitry and construction.

Figure 2:
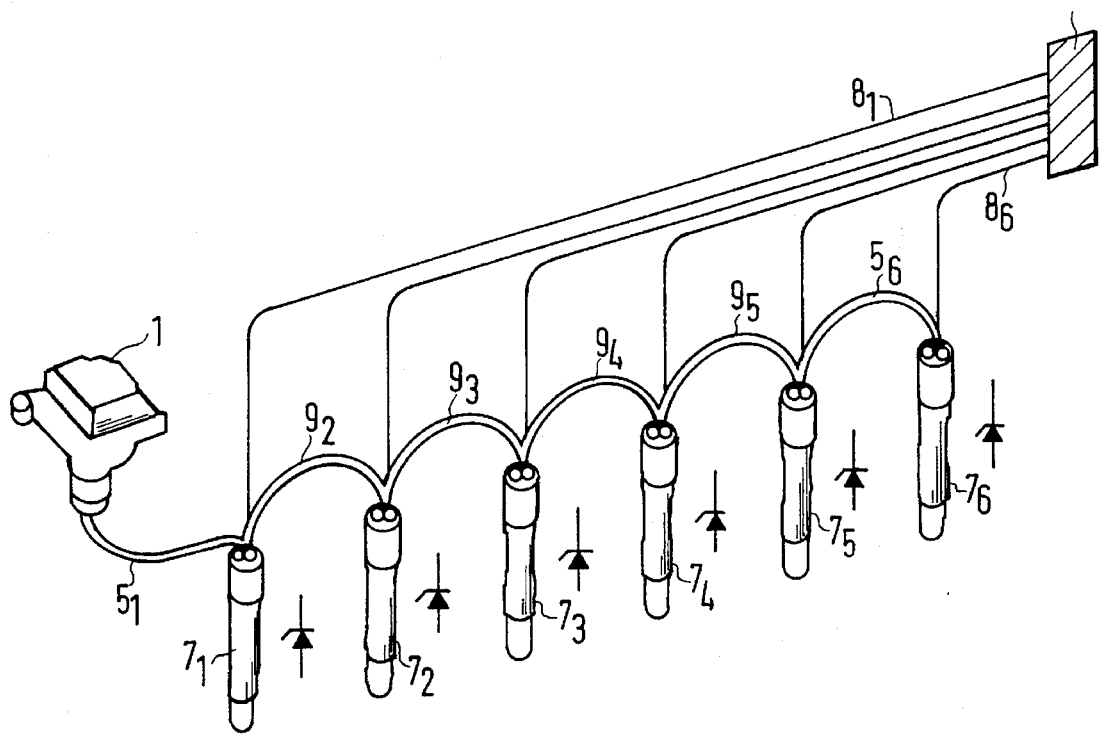
FIG. 2 is a diagram of the ignition system according to the invention.

This can also be seen from FIG. 2 which shows the design of the ignition system shown in FIG. 1. The electrical connection between spark plug connectors $7_1$ to $7_6$ is provided by electrical leads, designated $9_2$ to $9_5$ in FIG. 1, which creates the connection between parallel branches $5_1$ to $5_6$. The associated control device 10 is drawn schematically. semiconductor switches that are built into spark plug connectors $7_1$ through $7_6$ and are triggered by control leads $8_1$ to $8_6$ are also shown schematically by their circuit symbols. For this purpose, a light-emitting diode (not shown) is provided on the supply side of each of control leads $8_1$ to $8_6$ in the control device, which diode is activated at the same time the current is broken by the primary coil 2 for the respectively to be activated spark plug.

Figure 3:
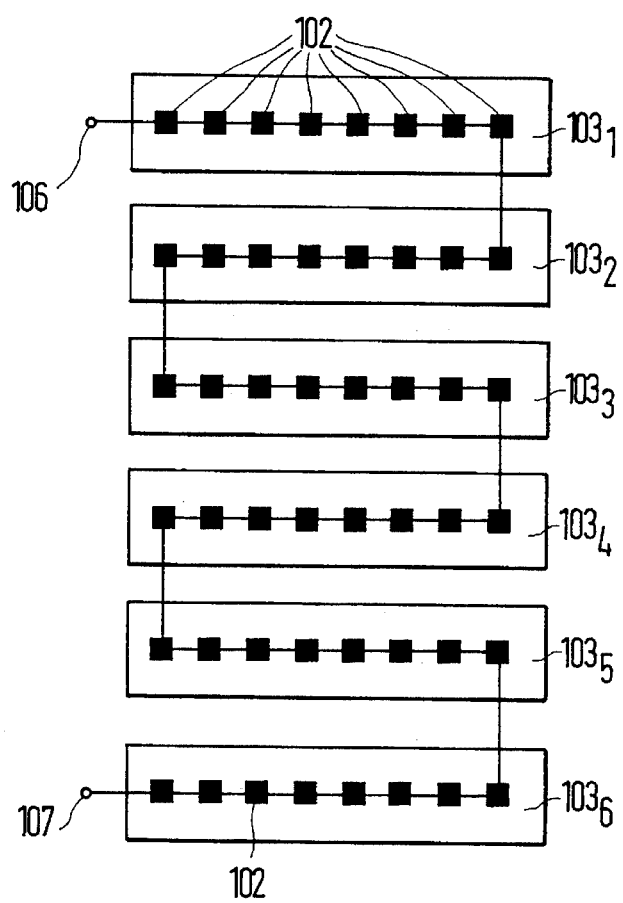
FIG. 3 is a high-voltage switch used in the ignition system of FIGS. 1 and 2 in a developed view.
Figure 4:
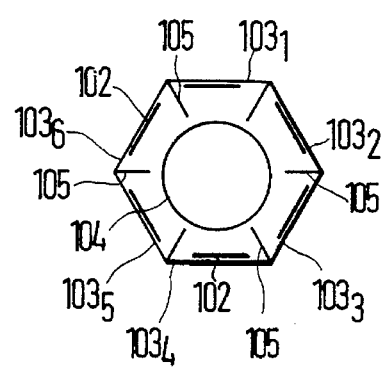
FIG. 4 shows the high-voltage switch of FIG. 3 built into a spark plug connector and in cross section.

For use as the semiconductor switches built into the spark plug connectors, an embodiment of a high-voltage switch 101 shown in FIG. 3 acts as a thyristor and comprises a total of 48 semiconductor components 102 arranged in six rows of eight components 102 on boards $103_1$ to $103_6$. Each of the semiconductor components 102 has a reverse voltage of 1200 V. The components 102 are wired in series in a meander shape as shown. Boards $103_1$ to $103_6$ are, as shown in FIG. 4, are connected and glued to each other in a hexagon shape. They surround a xenon tube 104 concentrically. Between each pair of neighboring boards ribs 105 are inserted to prevent a sparkover between two semiconductor components 102 on different boards. The total space between the xenon tube 104 and the boards $103_1$ to $103_6$ is filled with transparent (or translucent), highly insulated potting resin.

The arrangement shown in FIGS. 3 and 4 is located in a spark plug connector not shown, whose high-voltage terminal is connected to electrical lead 106 leading to board $103_1$ and whose spark plug terminal contact (not shown) is connected to the end of the lead 107.

In order to connect the spark plug to lead 107 with the high voltage, i.e. the high-voltage terminal 4 of the ignition coil 1, xenon tube 104 is triggered by one of the control leads $8_1$ to $8_6$. A high-voltage pulse is then able to reach lead 107 and hence the spark plug $6_1$ to $6_6$ via the semiconductor components 102. When the current through the control leads $8_1$ to $8_6$ then passes through zero, the semiconductor components 102 become nonconducting once again and can be triggered anew only by a further triggering process of the xenon tube 104.

For an internal combustion engine (not shown) with several cylinders, a single ignition coil is sufficient as a high-voltage source with the present invention. The cylinder-selective allocation of the high voltage to the individual cylinders takes place for each of the cylinders with the aid of the high-voltage switch shown. By simultaneous triggering of the high-voltage for two cylinders, it is also possible, e.g. in a cold start, to trigger two spark plugs at a time. By comparison with an ignition system in which each cylinder is provided with a single-coil ignition, this affords a considerable weight and cost saving, since only one common ignition coil and one spark plug connector for each spark plug need be provided, such a connector having a high-voltage switch according to the invention.

Although the invention has beer described and illustrated in detail, it is to be clearly understood that the same is by way of illustration and example, and is not to be taken by way of limitation. The spirit and scope of the present invention are to be limited only by the terms of t Re appended claims.

What is claimed is:

1. An optical ignition device for use in a distributor-less ignition system for an internal combustion engine, the device comprising:

a semiconductor switch including a plurality of optoelectronic semiconductor components wired in series and having a lead connectable to a high voltage; and a single common light-emitting element by which the semiconductor components are simultaneously activated, said plurality of optoelectronic semiconductor components being arranged around the single common light-emitting element at least approximately the same distance therefrom.

2. An optical ignition device according to claim 1, wherein several semiconductor components are arranged in one row one behind the other parallel to the single common light-emitting element and extending in a lengthwise direction.

3. An optical ignition device according to claim 2, wherein the semiconductor components are arranged in several rows around the single common light-emitting element.

4. An optical ignition device according to claim 3, wherein opposite rows of said several rows are optically seperated from each other by opaque ribs.

5. An optical ignition device according to claim 1, wherein a space between the single common light-emitting element and the semiconductor components is filled with translucent insulator.

6. An optical ignition device according to claim 1, wherein space between the light-emitting element and the semiconductor components is filled with transparent insulator.

7. An optical ignition device according to claim 3, wherein said several rows form a hexagonal shape.

8. An optical ignition device according to claim 1, wherein said single common light-emitting element is a xenon lamp.

* * * * *